July 29, 1952 R. C. CHEEK 2,605,396

FREQUENCY SELECTIVE DEVICE

Filed Jan. 21, 1949 2 SHEETS—SHEET 1

WITNESSES:

Robert C. Baird

[signature]

INVENTOR

Robert C. Cheek.

BY C. L. Freedman

ATTORNEY

WITNESSES:
Robert C. Baird
Wm. B. Groves

INVENTOR
Robert C. Cheek.
BY C. L. Freedman
ATTORNEY

Patented July 29, 1952

2,605,396

UNITED STATES PATENT OFFICE 2,605,396

FREQUENCY SELECTIVE DEVICE

Robert C. Cheek, Irwin, Pa., assignor to Westinghouse Electric Corporation, East Pittsburgh, Pa., a corporation of Pennsylvania Application January 21, 1949, Serial No. 71,825

11 Claims. (Cl. 250—20)

My invention relates to frequency-selective devices and it has particular relation to frequency-selective devices having a uniform band-pass range with sharp cut-off characteristics.

Frequency-selective devices such as filters are widely employed for the purpose of selecting from a wide range of frequencies a desired band of frequencies for subsequent operations. Such a device should have a low uniform attenuation over the pass band and should have high attenuation over the entire rejection range. In the conventional frequency-selective device or filter one or more tuned circuits employing inductive and capacitive reactances may be employed. Although by employing multiple tuned circuits a desired band-pass characteristic may be approximated, it is impossible to obtain therefrom the uniform transmission in the pass band and sharp cut-off at each end of the pass band which is desired.

In accordance with the invention a frequency-selective device is provied which has sharp cut-off characteristics. The device comprises a filter unit which first converts an incoming single-phase signal into a polyphase signal having a direction of phase rotation dependent on the direction of deviation of the incoming signal from a predetermined frequency. The filter unit includes a phase combiner which is responsive to the phase rotation of the polyphase signal. Consequently the output of the phase combiner is responsive to those frequencies of the incoming signal which deviate from the predetermined frequency in only one direction.

The filter unit also includes a single-sideband modulator wherein a carrier having the predetermined frequency is modulated by the output of the phase combiner to produce a single-sideband signal which is similar to the incoming signal except for the rejection of all frequencies of the incoming signal which deviate in a predetermined direction from the aforesaid predetermined frequency.

The filter unit embodying the invention may be employed in various circuits. For the purpose of illustration the filter unit will be described as a component of a single-sideband receiver and as a component of a super heterodyne receiver.

Referring first to the single-sideband receiver, the output of the aforesaid single-sideband modulator may be supplied to a suitable demodulator which mixes the output with the output of an oscillator having the carrier frequency employed in the generation of the single-sideband signal at the transmitting station. A polyphase signal is obtained having a phase rotation dependent on the direction of deviation of the frequency of the output of the single-sideband modulator from the carrier frequency. This polyphase signal is supplied to a phase combiner which is responsive to only one direction of rotation of the polyphase signal. The phase combiner is responsive to frequencies of the output of the single-sideband modulator which deviate only in a predetermined direction from the carrier frequency. This direction is so selected that the output of the final phase combiner includes frequencies which lie only within the desired pass band.

For the superheterodyne receiver two filter units may be employed in series, each of which is similar to the previously described filter unit, to pass only the band desired for the intermediate frequency section of the superheterodyne receiver. One of the filter units is designed to reject all frequencies above the desired band, whereas the remaining filter unit is designed to reject all frequenices of the incoming signal which are below the desired band.

It is therefore an object of the invention to provide an improved frequency-selective device.

It is a further object of the invention to provide a frequency-selective device including a filter unit for converting an incoming signal into a polyphase signal having a direction of phase rotation dependent on the direction of deviation of the frequency of the incoming signal from a predetermined frequency, and for modulating a carrier having the predetermined frequency by a modulating quantity responsive to only one direction of such phase rotation to produce a single-sideband output.

It is also an object of the invention to provide a single-sideband receiver wherein a demodulator is energized from the filter unit of the preceding paragraph, the demodulator comprising a mixer unit for converting the input thereto into a polyphase output having a phase rotation dependent on the direction of deviation of the input from a predetermined frequency and the demodulator having a phase combiner responsive to only one direction of rotation of such output.

It is a still further object of the invention to provide a filter including two filter units in series, each similar to the filter unit described in the penultimate paragraph.

It is an additional object of the invention to provide a superheterodyne receiver employing a filter similar to that described in the preceding paragraph.

Other objects of the invention will be apparent from the following description taken in conjunction with the accompanying drawings in which:

Figure 1 is a block diagram of a single-sideband receiver embodying the invention;

Figs. 2 through 5, inclusive, are vector diagrams showing vector relationships existing in the receiver of Fig. 1;

Figure 1:
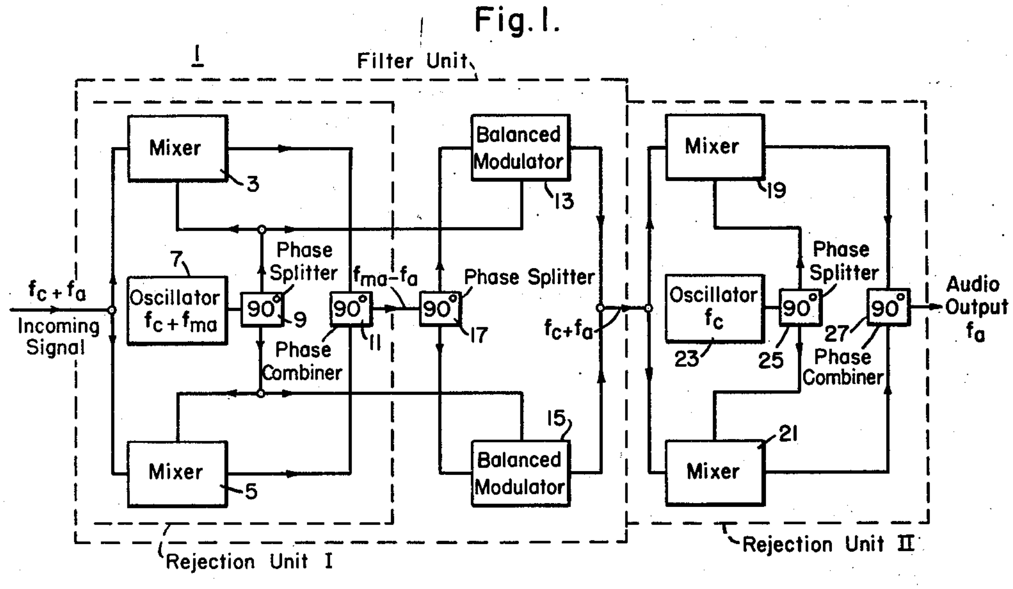
Figure 2:
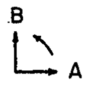
Figure 3:
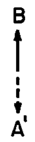

Referring to the drawings, Fig. 1 shows a filter unit 1 comprising a rejection unit I wherein an incoming signal is supplied in phase to two mixers 3 and 5. For the purpose of discussion, it will be assumed that the incoming signal is received from a single-sideband transmitter wherein a carrier represented by its frequency $f_c$ is modulated by an audio signal, such as a voice signal represented by its frequency $f_a$ to produce a single-sideband signal. It will be assumed further that the signal transmitted is the upper sideband which is a function of the sum of the carrier and audio frequencies $f_c+f_a$. In the following discussion the various signals and outputs will be represented by their frequencies.

Each mixer also is supplied from one phase of a polyphase generator or source of polyphase energy. In Fig. 1 the polyphase generator is illustrated as comprising an oscillator 7 which energizes a phase splitter 9. For illustrative purposes the phase splitter 9 may split the output of the oscillator into two phase components differing in phase by 90° to provide a source of two-phase voltage. The frequency of the oscillator is selected in accordance with the pass band desired. For present purposes, it will be assumed that the oscillator has a frequency $f_c+f_{ma}$ which is equal to the sum of the carrier frequency $f_c$ employed in generating the incoming signal and the maximum frequency $f_{ma}$ of the audio signal $f_a$.

The outputs of the mixers 3 and 5 comprise two phase components of a polyphase output having a direction of phase rotation dependent on the direction of deviation of the frequency of the incoming signal from the frequency of the oscillator 7. The outputs of the mixers are supplied to a phase combiner 11 which is responsive to only one direction of such phase rotation.

The output of the phase combiner may be understood more clearly by reference to Figs. 2 to 5. These figures show the outputs of the mixers 3 and 5 by vectors A and B which are assumed to have conventional counterclockwise vector rotation. It will be noted in Fig. 2 that the vectors illustrate a phase rotation wherein the vector A lags the vector B. Let it be assumed that the phase combiner 11 lags the vector A by 90° to the position illustrated by the vector A′ in Fig. 3. It will be noted that the vectors A′ and B now are in phase opposition and the output of the phase combiner 11 or resultant of the vectors A′ and B consequently is zero.

Figure 4:
Figure 5:

Let it be assumed next that the outputs of the mixers 3 and 5 have the phase rotation illustrated in Fig. 4. In Fig. 4 the vector A leads the vector B by 90°. Since the phase combiner is assumed to lag the vector A by 90° and to add the lagged vector to the vector B, the operation of the phase combiner is as illustrated in Fig. 5. In Fig. 5 the vector A has been lagged 90° to the position illustrated by the vector A′. Since the vectors B and A′ in Fig. 5 are in phase agreement a substantial output is derived from the phase combiner 11.

It will be understood that functions of the individual frequencies supplied to the mixers together with functions of the sum and difference of these frequencies appear in the outputs of the mixers. However, since these various components differ appreciably in frequency, one of the components readily may be selected for further operations. It will be assumed that the function of the difference between the frequencies of the incoming signal and of oscillator is selected for the output of the phase combiner. This function has a frequency $(f_c+f_{ma})-(f_c+f_a)=f_{ma}-f_a$. It will be noted that the output of the phase combiner is an audio signal which is a frequency inversion of the audio signal $f_a$.

As previously pointed out, the direction of phase rotation of the outputs of the mixers 3 and 5 depends on the direction of deviation of the frequency of the incoming signal from that of the oscillator 7. Consequently, by proper selection of the direction of phase rotation to which the phase combiner 11 responds, it is possible to eliminate from the incoming signal either all frequencies above the frequency $f_c+f_{ma}$ of the oscillator or all frequencies below that of the oscillator.

The selection of the phase combiner may be altered by reversing one of the phases supplied thereto or by changing the phase component lagged by the phase combiner. For example, let it be assumed that the phase combiner 11 lags the vector B of Fig. 2 by 90°. This would bring the vector A into phase agreement with the phase-shifted vector B and the phase combiner 11 would have a substantial output. When the same operation by the phase combiner is performed for the phase rotation of Fig. 4, the vectors are brought into phase opposition and the phase combiner has substantially zero output. Consequently, by proper adjustment of the rejection unit I frequencies of the incoming signal either above the oscillator frequency or below the oscillator frequency may be rejected as desired. As previously pointed out, it will be assumed that the rejection unit I rejects all frequencies of the incoming signal higher than the frequency $f_c+f_{ma}$.

The output of the rejection unit I which is a function of the frequency $f_{ma}-f_a$ next is restored to a form substantially similar to that of the incoming signal. This operation is effected by supplying the output of the phase combiner 11 to a single-sideband modulator for modulating the output of the oscillator 7. In Fig. 1 the single-sideband modulator comprises two balanced modulators 13 and 15. One phase component of the output of the phase splitter 9 is supplied to the balanced modulator 13, whereas the remaining phase component is supplied to the balanced modulator 15. The output of the phase combiner 11 is split into two phase components differing in phase by 90° by means of a phase splitter 17. One of the phase components of the phase splitter 17 is supplied to the balanced modulator 13, whereas the remaining phase component is supplied to the balanced modulators 15.

Since the modulators 13 and 15 are balanced, the carrier frequency supplied by the oscillator 7 is suppressed and only the upper and lower sidebands of the modulation products appear at the outputs of the balanced modulators. It will be assumed that the outputs of the balanced modulators are connected to supply the lower sideband which is a function of the frequency $(f_c+f_{ma})-(f_{ma}-f_a)=f_c+f_a$. It will be observed that the output of the signal-sideband modulator is identical with the incoming signal except for the fact that all frequencies, such as noise frequencies, higher in value than the frequency of the oscillator 7 are rejected.

It will be recalled that the output of the filter unit may be employed in various ways. In Fig. 1 the filter unit is associated with a rejection unit II or demodulator for demodulating the single-sideband signal. The rejection unit II includes a mixer 19, a mixer 21, an oscillator 23, a phase splitter 25 and a phase combiner 27. The rejection unit II may be similar to the rejection unit I except for the adjustment of the oscillator and the adjustment of the phase splitter or the phase combiner.

The oscillator 23 supplies a carrier having a frequency $f_c$ equal to that of the carrier initially used in the production at the transmitting station of the single-sideband signal which is to be received. Consequently, the outputs of the mixers 19 and 21 comprise a polyphase output having a direction of phase rotation which is dependent on the direction of deviation of the signal $f_c+f_a$ from the frequency of the oscillator 23. The phase splitter and the phase combiner are adjusted to reject all frequencies of the incoming signal which are lower in value than the frequency of the oscillator 23. Consequently, the output of the phase combiner 27 is equal to a function of $(f_c+f_a)-f_c$ or the desired audio signal $f_a$. The receiver of Fig. 1 consequently passes or selects a frequency range represented by the range of the initial modulating signal $f_a$. All frequencies above or below the desired pass band are rejected.

Figure 6:
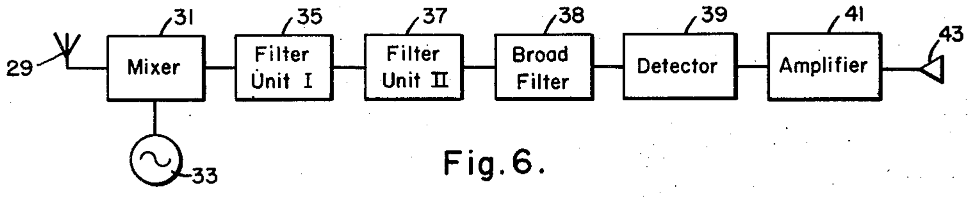
Fig. 6 is a block diagram of a superheterodyne receiver embodying the invention.

The filter unit of Fig. 1 also may be employed in a superheterodyne receiver in the manner illustrated in Fig. 6. The incoming signal which may be derived from an antenna 29 is supplied to a conventional first detector or mixer 31, together with the output of a local oscillator 33. The output of the mixer includes the desired intermediate frequency and may be passed to a band-pass intermediate-frequency filter before or after amplification. Such a filter includes two units 35 and 37, each of which is similar to the filter unit of Fig. 1. However, the filter unit 35 of Fig. 6 has its oscillator adjusted for a frequency equal to the maximum frequency to be transmitted through the pass-band and the phase splitter and phase combiner of the filter unit 35 are connected to reject all frequencies higher than such oscillator frequency. The filter unit 37 has its oscillator adjusted to a frequency equal to the minimum frequency of the pass-band and the phase splitter and phase combiner are connected to reject all frequencies below the oscillator frequency of the filter unit 37. As a result, the combined filter comprising the filter units 35 and 37 passes all frequencies within the desired pass-band and rejects all frequencies outside the desired pass-band. The filter unit 37 may be followed by a conventional second detector 39 and an amplifier 41 for the purpose of supplying an input to a suitable translating device 43 such as a loud speaker.

As hereinafter set forth, phase splitters and phase combiners can be designed which are effective over a substantial frequency range. With such splitters and combiners, the filter of Fig.

6 can be designed to pass uniformly any frequency within the desired pass band and to attenuate substantially any frequency for a substantial range on each side of the pass band. If rejection of frequencies for a still further range is desired, a broad filter 38 may be provided. This may be of conventional construction, and is tuned broadly to pass the frequencies of the desired pass band and to attenuate substantially only those frequencies which are too greatly removed from the pass band to be rejected adequately by the filter units 35 and 37. Because it may be designed to pass a very broad band of frequencies, the broad filter 38 has substantially no effect on the pass-band frequencies of the filter units 35 and 37.

Figures 7, 8:
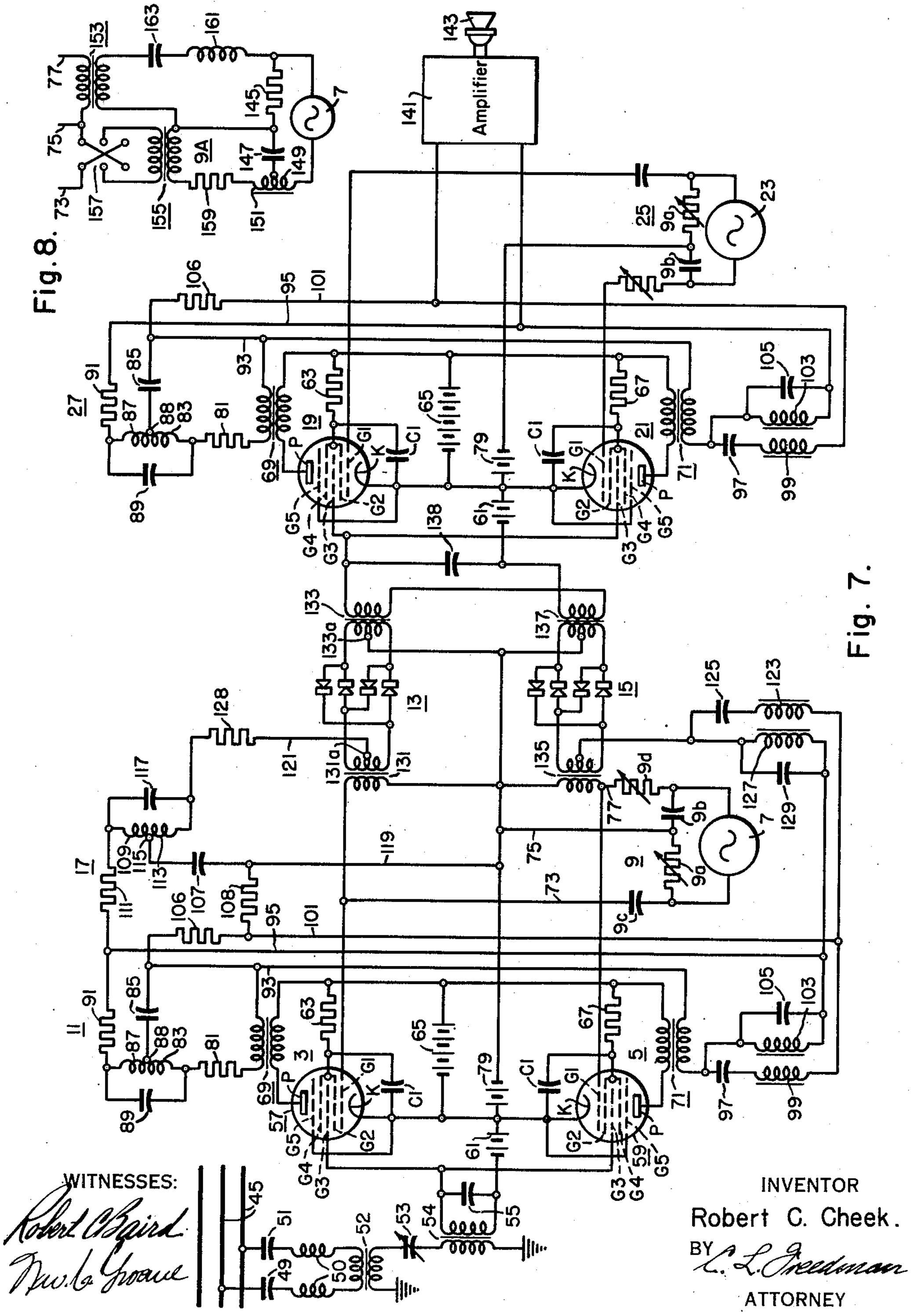
Fig. 7 is a schematic view of a circuit suitable for the single-sideband receiver of Fig. 1.
Fig. 8 is a schematic view of a polyphase generator.

Suitable circuits for the single-sideband receiver of Fig. 1 are illustrated in Fig. 7. The incoming signal may be transmitted in any desired manner. For example it may be transmitted through space. However, it will be assumed that the signal is transmitted over suitable conductors such as two conductors of a three phase 60-cycle power supply circuit 45. The two conductors of the circuit 45 between which the single-sideband signal appears may be coupled to the receiver through suitable coupling capacitors 49 and 51 and tuning inductance coils 50 and a transformer 52. The secondary winding of the transformer 52 is connected through a tuning capacitor 53 to the primary winding of a coupling transformer 54 having a tuning capacitor 55 across its secondary winding. The receiver input is supplied by the transformer 54 to the two mixers 3 and 5.

Any conventional mixer may be employed for the mixers 3 and 5. In the specific embodiment of Fig. 7, the mixer 3 comprises a pentagrid mixer tube 57 having five grids G1, G2, G3, G4 and G5. The tube also contains a cathode K and an anode or plate electrode P. Tubes of this type are well known in the art, one such type having the trade designation 6SA7. The mixer 5 includes a mixer tube 59 which is similar in construction to the tube 57.

One terminal of the secondary winding of the coupling transformer 53 is connected to the grids G3 of the tubes 57 and 59. The remaining terminal of the secondary winding is connected through a suitable biasing battery 61 to the cathode K of the tubes 57 and 59. The grids G5 of the two tubes are suppressor grids which are connected to the cathodes of the tubes. The screen grids G2 and G4 of the tube 57 are connected through a resistor 63 to the positive terminal of a plate voltage battery 65. The negative terminal of the battery 65 is connected to the cathodes K of the two tubes. In a similar manner, the screen grids G2 and G4 of the tube 59 are connected through a resistor 67 to the positive terminal of the battery 65. A by-pass capacitor C1 is connected between each cathode and its associated screen grids. The plate electrode P of the tube 57 is connected to the positive terminal of the battery 65 through the primary winding of an output transformer 69. In a similar fashion the plate electrode P of the tube 59 is connected through the primary winding of an output transformer 71 to the positive terminal of the battery 65.

The oscillator 7 may be of any conventional construction. For power-line carrier transmission, it is conventional to employ carrier frequencies of the order of 50 to 300 kilocycles per second. Stable electronic oscillators capable of operation at such frequencies are well known in the art.

The output of the oscillator 7 is supplied to the phase splitter 9. In the embodiment of Fig. 7 the phase splitter comprises a resistor 9a and a capacitor 9b which are connected in series across the output of the oscillator 7. As these components are designed to provide a resistive impedance of the resistor 9a which is equal to the capacitive impedance of the capacitor 9b at the desired frequency of the oscillator 7, the voltages across the resistor and the capacitor will be equal in magnitude and will differ in phase by 90°. The voltage across the resistor 9a is applied between the grid G1 and the cathode K of the tube 57 through conductors 73 and 75. The voltage across the capacitor 9b is connected between the cathode K and the grid G1 of the tube 59 through the conductor 75 and a conductor 77. To equalize the internal impedances of the output circuits of the phase splitter, a capacitor 9c equal in capacitance to the capacitor 9b may be inserted in the conductor 73. Also a resistor 9d equal in resistive impedance to the resistor 9a may be inserted in the conductor 77. A suitable biasing battery 79 may be inserted between the cathodes K of the two tubes and the conductor 75.

It will be recalled that the outputs of the mixers 3 and 5 are applied to a phase combiner 11. To this end, the secondary winding of the transformer 69 has connected thereacross a series circuit which includes a resistor 81, an inductance coil 83 and a capacitor 85. The coil 83 has inductively coupled thereto a coil 87. The coils 83 and 87 may be provided by sections of a single coil having a center tap 88 connected to one terminal of the capacitor 85. A capacitor 89 is connected across the coils 83 and 87. The voltages across the capacitor 85 and coil 87 vary in magnitude in opposite directions as the frequency of the applied energization changes. Consequently, the voltage across the capacitor 85 and the coil 87 in series remains substantially constant and is displaced 90° from the voltage across the resistor 81 over a substantial range of frequency variation.

The voltage across the capacitor 85 and the coil 87 in series is applied through a resistor 91, across conductors 93 and 95. This voltage is added to the voltage across the secondary winding of the coupling transformer 71. The two voltages will be in phase agreement or in phase opposition depending on the direction of deviation of the frequency of the incoming signal from that of the oscillator 7. One terminal of the secondary winding of the transformer 71 is connected to the conductor 93 and the remaining terminal is connected through a capacitor 97 and an inductance coil 99 to a conductor 101. Consequently the output of the phase combiner 11 may be said to appear between the conductors 95 and 101. A parallel resonant circuit comprising an inductance coil 103 and a capacitor 105 may be connected between the conductor 95 and a common connection between the secondary winding of the transformer 71 and the capacitor 97, for the purpose of increasing the frequency range of the phase combiner 11.

The capacitor 85 and the inductance introduced by the coil 83 across the secondary winding of the transformer 69 may be resonated to a frequency which is the geometric mean of the frequency range for which the phase combiner is designed. Similarly the parallel circuit represented by the capacitor 89 and the coils 83 and 87, the parallel circuit represented by the capacitor 105 and the coil 103 and the series circuit represented by the capacitors 97 and the coil 99, all may be resonated to the aforesaid geometric main frequency. The resistor 81 is useful in limiting current supplied to the phase combiner and the resistor 91 serves a similar purpose. A resistor 106 is connected between the conductors 93 and 101 to serve as a load for the coupling transformer 71. The resistor 106, the capacitor 97 and the coil 99 preferably are proportioned in accordance with the impedance values of the resistor 81, the capacitor 85 and the coil 83 to equalize the internal impedances of the two input circuits of the phase combiner. A phase combiner in a single sideband receiver is shown in the B. E. Lenehan patent application Serial No. 24,037, filed April 29, 1948, and assigned to the same assignee.

The phase splitter 17 follows the phase combiner 11 and may be similar in construction except for the reversal of input and output circuits. The input circuit for the phase splitter 17 comprises in series, a resistor 108, a capacitor 107, an inductance coil 109 and a current limiting resistor 111. A coil 113 is inductively coupled to the coil 109 and the two coils may be constructed from a single winding having a center tap 115. A capacitor 117 is connected across the two coils 109 and 113. The voltage across the resistor 108 is substantially in quadrature with the voltage across the capacitor 107 and the coil 113 in series and equal thereto over a substantial range of variation of the frequency of the input to the phase splitter. Consequently, one phase output of the phase splitter may be derived from the conductor 101 and a conductor 119, whereas the remaining phase may be derived from the conductor 119 and a conductor 121. In order to equalize the internal impedances of the output circuits for the phase splitter, the conductor 101 may be connected in series with a series circuit comprising a coil 123 and a capacitor 125. The frequency range of the phase splitter may be improved by connecting a circuit including a coil 127 and a capacitor 129 in parallel between the conductor 95 and the upper terminal of the capacitor 125 as viewed in Fig. 7. The internal impedances of the output circuits further may be improved or matched by including a resistor 128 in the conductor 121 to compensate for the resistance introduced by the resistor 108. The phase splitter 17 is based on one illustrated in an article entitled "A New Single-Sideband Carrier System For Power Lines" by B. E. Lenehan which appears in vol. 66 of the American Institute of Electrical Engineers Transactions 1947 (paper 47-112). It will be understood further that the phase combiner 11 is substantially a reversal of the phase splitter 17.

The output of the phase splitter 17 is supplied to the single-sideband modulator which includes the two balanced modulators 13 and 15. These modulators may be of any desired construction but in the embodiment illustrated in Fig. 7 they are illustrated as barrier-layer ring modulators.

The barrier-layer ring modulator 13 is energized in accordance with one phase component of the output of the oscillator 7 and one phase component of the output of the phase splitter 17. To this end a coupling transformer 131 has its primary winding connected across the conductors 73 and 75 for energization in accordance with the voltage across the resistors 9a. The secondary winding of the transformer 131 is connected across one diagonal of the ring modulator. The output from the ring modulator is applied across the primary winding of an output transformer 133. Modulating voltage for the ring modulator 13 is applied between center taps 131a and 133a respectively on the secondary winding of the coupling transformer 131 and the primary winding of the output transformer 133. These taps are connected respectively to the conductor 121 and the conductor 119 for energization in accordance with one phase component of the output of the phase splitter 17.

The ring modulator 15 is connected for energization from the remaining phases of the phase splitter 17 and the oscillator 7 in a similar manner. The primary winding of a coupling transformer 135 is connected between the conductors 75 and 77 for energization in accordance with the voltage across the capacitor 9b. The secondary winding of this transformer is connected across one diagonal of the ring modulator 15. The output of the ring modulator is obtained through an output transformer 137 having a primary winding connected across a second diagonal of the ring modulator. Center taps on the secondary winding of the transformer 135 and the primary winding of the transformer 137 are connected respectively to the capacitor 125 and to the conductor 119 for energization in accordance with the voltage across the resistor 108.

Since the modulators 13 and 15 are balanced, the frequency of the oscillator 7 is suppressed. The outputs of the modulators represent the sum and difference of two sidebands and these may be added or subtracted by connecting the secondary windings of the transformers 133 and 137 in series to provide either the upper sideband or the lower sideband as desired. It will be assumed that the secondary windings are connected to produce the upper sideband but it will be understood that by reversing the terminals of the secondary windings of the output transformers 133 and 137 the lower sideband may be produced. A capacitor 138 may be connected across the output terminals of the modulator for the purpose of tuning the output transformers. The single-sideband modulator of Fig. 7 is substantially similar to that described in the aforesaid Lenehan article.

The output of the single-sideband modulator is applied to the mixers 19 and 21. These mixers may be similar to the mixers 3 and 5 and similar reference characters identify similar parts. The oscillator 23 and phase splitter 25 may be similar to the oscillator 7 and phase splitter 9 in construction. The only differences reside in the frequency to which the oscillator 23 is adjusted and in the connections of the phase splitter 25 to the mixers 19 and 21. It will be noted that the voltage across the capacitor 9b of the phase splitter 25 is connected across the grid G1 and cathode K of the lower mixer 21, whereas the capacitor 9b associated with the phase splitter 9 was connected across the corresponding elements of the upper mixer 3. The voltage across the resistor 9a of the phase splitter 25 is connected between the grid G1 and cathode K of the upper mixer 19. The purpose of this reversal is to eliminate all frequencies from the incoming signal which are lower than the frequency of the oscillator 23. The phase combiner 27 is similar to the phase combiner 11 and is similarly connected to the associated mixers. The output of the phase combiner 27 is applied to a conventional amplifier 141 and the output of the amplifier energizes a suitable translating device such as a loud speaker 143.

When a phase splitter 9 of the simple type illustrated in Fig. 7 is employed, the frequency of the associated oscillator cannot be altered appreciably without readjusting the components of the phase splitter if optimum performance is desired. A phase splitter 9A permitting substantial variation in frequency of the oscillator 7 without readjustment of the phase splitter is illustrated in Fig. 8. The output of the oscillator 7 in Fig. 8 is applied across a series circuit which includes a resistor 145, a capacitor 147 and an inductance coil 149. The inductance coil is mutually connected to an inductance coil 151. The coils may be constructed from a single winding having a center tap connected to the capacitor 147. Inasmuch as the voltages across the coil 151 and capacitor 147 vary oppositely in magnitude in response to a change in frequency of the oscillator 7, the output voltage across the capacitor 147 and the coil 151 in series remains substantially constant over an appreciable range of variation in frequency of the oscillator 7. Moreover, this voltage is substntially in quadrature with the voltage across the resistor 145. The voltage across the resistor 145 may be applied across the primary winding of an output transformer 153 which has its secondary winding connected between the conductors 75 and 77. The voltage across the coil 151 and the capacitor 147 in series is applied across the primary winding of an output transformer 155 which has its secondary winding connected through a reversing switch 157 to the conductors 73 and 75. In order to equalize the internal impedances of the output circuits of the phase splitter, a resistor 159 may be included in the energizing circuit for the transformer 155 to compensate for the resistor 145. For the same reason an inductance coil 161 and a capacitor 163 may be included in the energizing circuit for the transformer 153 to compensate for the capacitor 147 and the inductance introduced by the coil 151 in the energizing circuit for the transformer 155.

The capacitor 147 and the inductance introduced by the coil 149 across the oscillator 7 may be resonated to the geometric means of the range of frequencies over which the oscillator 7 is to be adjusted. Similarly the series resonant circuit comprising the coil 161 and the capacitor 163 may be resonated to the same geometric means frequency. If the phase splitter of Fig. 8 is employed in place of that illustrated in Fig. 7 the frequency of the oscillator 7 may be adjusted over an appreciable range without disturbing the phase splitter. The provision of the reversing switch 157 permits a reversal of the phase rotation of the outputs of the mixers 3 and 5 without necessitating a reconnection of the phase splitter. A phase splitter similar to that illustrated in Fig. 8 also may be employed as the phase splitter 25 of Figs. 1 and 7.

Although the invention has been described with reference to certain specific embodiments thereof numerous modifications falling within the spirit and scope of the invention are possible.

I claim as my invention:

1. In an electrical device for passing frequencies within a band having a predetermined limiting frequency, a filter unit comprising a source of alternating voltage having said limiting frequency, a phase-splitting mixer for combining an incoming signal with the output of the source to provide a plurality of signal components differing in phase, said filter unit including a phase combiner for combining the signal components to provide a resultant signal, a modulator for modulating the first resultant signal and the output of the source to produce a pair of modulator outputs having frequencies which include a function of the sum and a function of the difference of the frequencies of the resultant signal and of the source, and means for adding the modulator outputs to provide a second resultant output which comprises only one of said functions.

2. A device as defined in claim 1 in combination with a second source of alternating voltage having a second limiting frequency, the band being between said two limiting frequencies, a phase-splitting mixer for combining the second resultant output with the output of the second source of alternating voltage to provide a plurality of second signal components differing in phase, and a phase combiner for combining the second signal components to provide a third resultant signal.

3. A device as claimed in claim 2 in combination with a single-sideband modulator for modulating the last-named third resultant signal and the output of the second source and selecting one of the sidebands of such modulation.

4. In an electrical device for passing frequencies within a band having a predetermined limiting frequency, a polyphase source of alternating voltage, a mixer for mixing an incoming signal with each of a plurality of carrier phase components derived from the source to provide a plurality of signal components differing in phase, a phase combiner for combining the signal components to provide a first resultant single-phase signal, and a single-sideband modulator for modulating the source by the single-phase signal to produce a single-sideband signal.

5. A device as defined in claim 4 in combination with a second source of alternating voltage having a second limiting frequency, the band being between the two limiting frequencies, a phase splitting mixer for combining the single sideband signal with the output of the second source to provide a plurality of second signal components differing in phase, and a phase combiner for combining the second signal components to provide a second resultant signal.

6. A device as claimed in claim 5 in combination with a single-sideband modulator for modulating the second resultant signal and the output of the second source and selecting one of the sidebands of such modulator.

7. A device as claimed in claim 4 in combination with a filter having a pass band substantially larger than the first-named band.

8. In an electrical device for passing frequencies within a band having a predetermined limiting frequency, a two-phase voltage source having said limiting frequency, a mixer for mixing an incoming signal with a first phase of the source to provide a first signal component, a mixer for mixing the incoming signal with a second phase of the source to provide a second signal component, said signal components comprising a two-phase output having a phase rotation direction dependent on the direction of deviation of the frequency of the incoming signal from the frequency of the source, a phase combiner for rotating one of the signal components into phase or phase opposition relative to the other of the signal components depending on the direction of said phase rotation and adding the signal components after such rotation by the combiner to provide a first resultant signal substantially responsive to an incoming signal having a frequency located on only one side of the limiting frequency, and a single-sideband modulator for modulating the output of the source by the resultant signal to produce a single-sideband signal.

9. A device as defined in claim 8 in combination with a second two-phase voltage source having a second limiting frequency, the band being between the two limiting frequencies, a mixer for mixing the single-sideband signal with a first phase of the source to provide a first output signal, a mixer for mixing the single-sideband signal with a second phase of the source to provide a second output signal, said output signals comprising a two-phase output having a phase rotation direction dependent on the direction of deviation of the single-sideband signal frequency from the frequency of the second two-phase voltage source, and a phase combiner for rotating one of the output signals into phase or phase opposition relative to the other of the signal components depending on the direction of said last-mentioned phase rotations and adding the output signals after such phase rotation by the last-mentioned phase combiner to provide a second resultant output signal.

10. A device as defined in claim 9 combination with a single-sideband modulator for modulating the output of the second voltage source by the second resultant output signal and selecting one of the sidebands of such modulation.

11. A device as defined in claim 9 wherein at least one of the sources is adjustable for producing outputs of various frequencies.

ROBERT C. CHEEK.

REFERENCES CITED

The following references are of record in the file of this patent:

UNITED STATES PATENTS

| Number | Name | Date |
|---|---|---|
| 1,747,160 | Carpe | Feb. 18, 1930 |
| 1,773,116 | Potter | Aug. 19, 1930 |
| 2,020,409 | Green | Nov. 12, 1935 |
| 2,044,745 | Hansell | June 16, 1936 |
| 2,168,461 | Wheeler | Aug. 8, 1939 |
| 2,379,052 | Weaver | June 26, 1945 |
| 2,494,323 | Weber | Jan. 10, 1950 |

FOREIGN PATENTS

| Number | Country | Date |
|---|---|---|
| 606,152 | Germany | Nov. 8, 1934 |

OTHER REFERENCES

Practical Single Sideband Reception, QST, July 1948, pages 11 to 15.